US011302648B2

(12) United States Patent
Murtuza et al.

(10) Patent No.: US 11,302,648 B2
(45) Date of Patent: Apr. 12, 2022

(54) EMI SHIELD FOR MOLDED PACKAGES

(71) Applicant: Octavo Systems LLC, Sugar Land, TX (US)

(72) Inventors: Masood Murtuza, Sugar Land, TX (US); Peter Robert Linder, Sugar Land, TX (US); Gene Alan Frantz, Sugar Land, TX (US)

(73) Assignee: OCTAVO SYSTEMS LLC, Sugar Land, TX (US)

( * ) Notice: Subject to any disclaimer, the term of this patent is extended or adjusted under 35 U.S.C. 154(b) by 0 days.

(21) Appl. No.: 16/898,023

(22) Filed: Jun. 10, 2020

(65) Prior Publication Data

US 2020/0303321 A1  Sep. 24, 2020

Related U.S. Application Data

(63) Continuation of application No. 16/041,357, filed on Jul. 20, 2018, now Pat. No. 10,714,430.
(Continued)

(51) Int. Cl.
*H01L 23/552* (2006.01)
*H01L 23/00* (2006.01)
(Continued)

(52) U.S. Cl.
CPC .......... *H01L 23/552* (2013.01); *H01L 21/56* (2013.01); *H01L 23/16* (2013.01); *H01L 24/17* (2013.01);
(Continued)

(58) Field of Classification Search
CPC ......... H01L 23/16; H01L 21/56; H01L 24/17; H01L 23/49827; H01L 23/49838; H01L 23/3128; H01L 23/49816; H01L 2224/16227; H01L 2924/181; H01L 23/49822; H01L 2924/15311; H01L 2924/3025; H01L 24/16;
(Continued)

(56) References Cited

U.S. PATENT DOCUMENTS 4,667,403 A   5/1987  Edinger
5,365,410 A  11/1994  Lonka
(Continued)

FOREIGN PATENT DOCUMENTS

EP    1926138 A1    5/2008
WO    9852226 A1   11/1998
WO  2016025693 A1    2/2016

OTHER PUBLICATIONS

International Search Report and Written Opinion issued in Application No. PCT/US2015/045022, dated Nov. 4, 2015, 14 pages.
(Continued)

*Primary Examiner* — Cuong B Nguyen
(74) *Attorney, Agent, or Firm* — Rothwell, Figg, Ernst & Manbeck, P.C.

(57) ABSTRACT

Electromagnetic interference (EMI) shielding structures for use inside an electronic system are provided, which allow access for mold compound or cables by using baffle-like features on the shield's sides and/or top, as well as methods for shielding components from EMI, or for containing EMI. The structures block external RF from sensitive components and reduce EMI emission from internal, RF generating components.

17 Claims, 16 Drawing Sheets

Related U.S. Application Data

(60) Provisional application No. 62/535,699, filed on Jul. 21, 2017.

(51) Int. Cl.
| | |
|---|---|
| *H01L 21/56* | (2006.01) |
| *H01L 23/16* | (2006.01) |
| *H01L 23/498* | (2006.01) |
| *H01L 23/31* | (2006.01) |

(52) U.S. Cl.
CPC .... *H01L 23/3128* (2013.01); *H01L 23/49816* (2013.01); *H01L 23/49822* (2013.01); *H01L 23/49827* (2013.01); *H01L 23/49838* (2013.01); *H01L 24/16* (2013.01); *H01L 2224/16227* (2013.01); *H01L 2224/16235* (2013.01); *H01L 2924/15311* (2013.01); *H01L 2924/181* (2013.01); *H01L 2924/3025* (2013.01)

(58) Field of Classification Search
CPC ........... H01L 2224/16235; H01L 23/60; H01L 23/552–556; H01L 23/64–66
See application file for complete search history.

(56) References Cited

U.S. PATENT DOCUMENTS

| | | | |
|---|---|---|---|
| 5,396,403 | A | 3/1995 | Patel |
| 5,422,433 | A | 6/1995 | Rivera et al. |
| 5,683,788 | A | 11/1997 | Dugan |
| 5,696,029 | A | 12/1997 | Alvarez et al. |
| 5,838,551 | A | 11/1998 | Chan |
| 6,133,626 | A | 10/2000 | Hawke |
| 6,268,238 | B1 | 7/2001 | Davidson |
| 6,297,967 | B1 | 10/2001 | Davidson et al. |
| 7,060,535 | B1 | 6/2006 | Sirinorakul et al. |
| 8,065,576 | B2 | 11/2011 | Miner et al. |
| 9,490,188 | B2 | 11/2016 | Arvelo et al. |
| 2002/0017708 | A1 | 2/2002 | Takagi et al. |
| 2002/0052054 | A1 | 5/2002 | Akram |
| 2002/0170901 | A1 | 11/2002 | Lau |
| 2003/0080836 | A1* | 5/2003 | Nagaishi ............ H01P 1/047 333/247 |
| 2003/0110427 | A1 | 6/2003 | Rajsuman et al. |
| 2004/0229400 | A1 | 11/2004 | Chua |
| 2005/0280127 | A1* | 12/2005 | Zhao ............... H01L 23/24 257/678 |
| 2007/0278632 | A1 | 12/2007 | Zhao et al. |
| 2008/0029868 | A1 | 2/2008 | Lee |
| 2008/0217753 | A1 | 9/2008 | Otani |
| 2008/0288908 | A1 | 11/2008 | Hart et al. |
| 2008/0290486 | A1 | 11/2008 | Chen et al. |
| 2009/0278245 | A1 | 11/2009 | Bonifield et al. |
| 2010/0052135 | A1 | 3/2010 | Shim et al. |
| 2010/0134133 | A1 | 6/2010 | Pagani |
| 2011/0233753 | A1 | 9/2011 | Camacho et al. |
| 2012/0241984 | A9 | 9/2012 | Pendse |
| 2013/0214386 | A1 | 8/2013 | Xie |
| 2015/0130040 | A1 | 5/2015 | Defretin |

OTHER PUBLICATIONS

International Search Report and Written Opinion issued in Application No. PCT/US16/50157, dated Jan. 17, 2017, 24 pages.
International Search Report and Written Opinion issued in Application No. PCT/US17/015728, dated Jun. 6, 2017, 16 pages.
International Search Report and Written Opinion issued in Application No. PCT/US17/49611, dated Dec. 27, 2017, 17 pages.
International Search Report and Written Opinion issued in Application No. PCT/US17/052014, dated Dec. 4, 2017, 15 pages.
International Search Report and Written Opinion issued in Application No. PCT/US18/16171, dated Apr. 25, 2018, 12 pages.
C.R. Schlottmann, "Analog Signal Processing on a Reconfigurable Platform", Master's Thesis, School of Electrical and Computer Engineering, Georgia Institute of Technology, Aug. 2009, 72 pages.
J. McEleney, et al., "Multisite Test Strategy For SIP Mobile Technologies", Jul. 2006, 6 pages.
R. Normann, "First High-Temperature Electronics Products Survey 2005", Sandia Report, Apr. 2006, 44 pages.
S. Bernard, et al., "Testing System-In Package Wirelessly", IEEE, DTIS'06: Design and Test of Integrated Systems in Nanoscale Technology, Sep. 2006, Tunis (Tunisia), pp. 222-226, http://hal-lirmm.ccsd.cnrs.fr/lirmm-00094916, Sep. 15, 2006.
D. Appello, et al., "System-in-Package Testing: Problems and Solutions", IEEE, May-Jun. 2006, 4 pages.
Z. Noun, et al., "Wireless Approach for SIP and SOC Testing", Micro and nanotechnologies/Microelectronics, Université Montpellier II—Sciences et Techniques du Languedoc, 2010, English, https://tel.archives-ouvertes.fr/tel-00512832, Aug. 31, 2010, 66 pages.
P. O'Neill, "Choosing the Right Strategy for SIP Testing", EE Times, Connecting the Global Electronics Community, May 10, 2004, 2 pages.
M., Quirk, et al., "Semiconductor Manufacturing Technology", IC Fabrication Process Overview, Chapter 9, Oct. 2001, 41 pages.
J. Watson, et al., "High-Temperature Electronics Pose Design and Reliability Challenges", Analog Dialogue 46-04, Apr. 2012, 7 pages.
S. Benjaafar, et al., "Batch Sizing Models for Flexible Manufacturing Cells", Submitted to International Journal of Production Research, Department of Mechanical Engineering, University of Minnesota, 1995, 43 pages.
C. T. Sorenson, "Semiconductor Manufacturing Technology: Semiconductor Manufacturing Processes", NSF/SRC Engineering Research Center for Environmentally Benign Semiconductor Manufacturing, Arizona Board of Regents for The University of Arizona, 1999, 34 pages.
"Downhole Solutions", Motion Control Solutions Tailored to Your Critical Downhole Applications, What Moves Your World, MOOG, May 2013, 8 pages.
A. Weintraub, "Is Mass Customization the Future of Retail?", https://www.entrepreneur.com/article/229869, Nov. 14, 2013, 5 pages.
Hashimoto et al., "A System-in-Package (SiP) With Mounted Input Capacitors for Reduced Parasitic Inductances in a Voltage Regulator," 2010, IEEE, 25(3), pp. 731-740.
Office Action issued for U.S. Appl. No. 15/503,932 dated Jan. 5, 2018, 20 pages.
Final Office Action issued for U.S. Appl. No. 15/503,932 dated Aug. 2, 2018, 9 pages.
Office Action issued for U.S. Appl. No. 15/968,184 dated Nov. 15, 2018, 25 pages.

\* cited by examiner

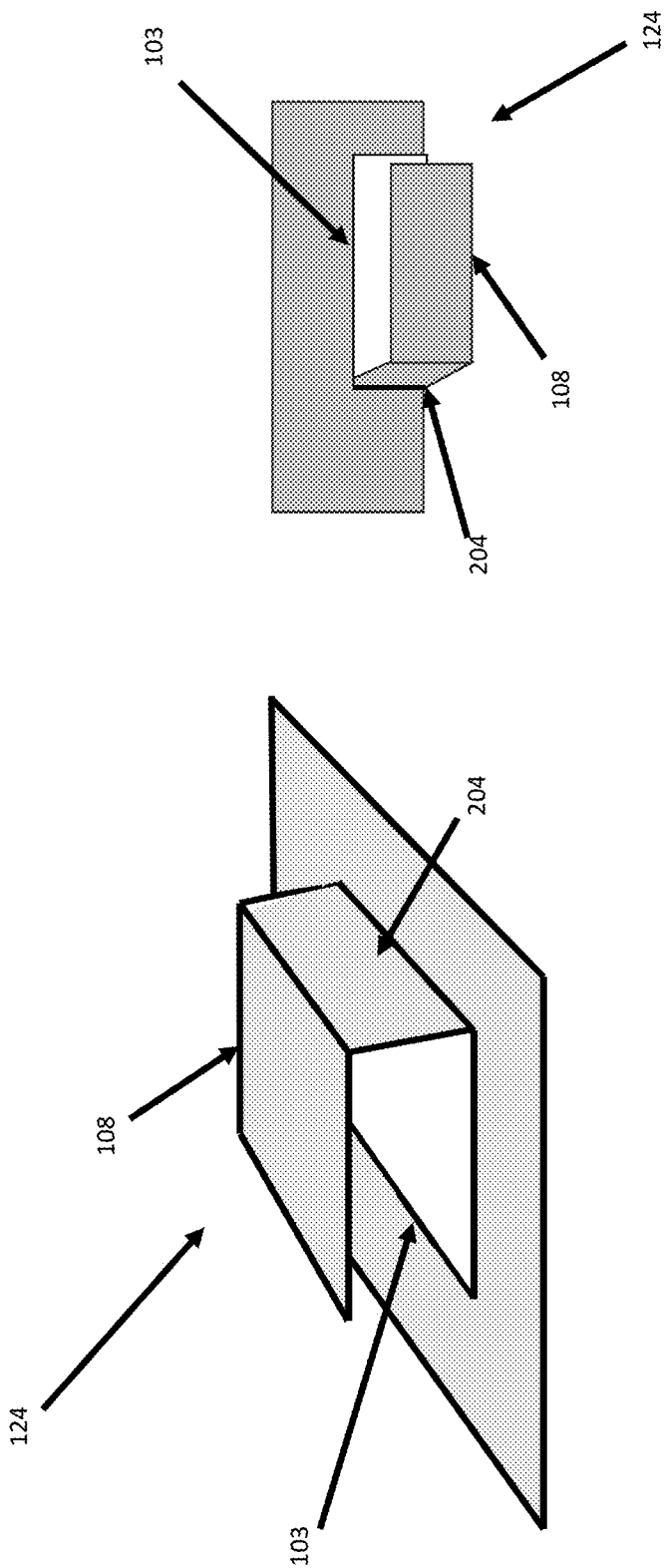

380

381 wrap a sheet of metal to form a metal structure in a spiral shape configured to encompass the perimeter of an RF device 382 attach a top wall portion

582 → form ground traces around the interface of a RF output of a RF generating component with the interconnection pad on a top surface of the substrate 584 → create an RF signal path from the interconnection pad through multiple internal connection layers using vias, where the RF signal path from the interconnection pad through a plurality of the multiple layers to each of the internal connection layers is shielded 586 → create an RF signal path from a final internal connection layer to an external RF output of the integrated circuit using a via, such that the RF signal path from the internal connection layer to the RF output is shielded

652 — create an RF signal path from the output of said RF generating component located above an external RF output that passes through said multiple layers of said substrate to the external RF output for said integrated circuit 654 — operate an RF component such that the RF signal path through said multiple layers using grounded vias and grounded conductive surfaces surrounding said RF signal path for multiple pluralities of said multiple layers is shielded

FIG. 6C

EMI SHIELD FOR MOLDED PACKAGES

CROSS REFERENCE TO RELATED APPLICATION

This application is a Continuation of U.S. patent application Ser. No. 16/041,357 filed on Jul. 20, 2018, which claims the benefit of U.S. Provisional Patent Application No. 62/535,699 filed on Jul. 21, 2017, the disclosure of which is incorporated herein by reference in its entirety.

TECHNICAL FIELD

Aspects of the present disclosure relate to the RF shielding of components in a molded package from Electro-Magnetic Interference (EMI).

BACKGROUND

System in Package (SIP) technology allows the integration into one package of the multiple die, devices and components needed to make up a system. As more diverse technologies are used to manufacture die, SIPs are becoming useful for including and integrating all these various dies into a system or subsystem. These systems often have a need to communicate with other systems or networks and are including components that transmit and receive radio frequency (RF) signals (so-called "wireless components").

In SIP molded packages, different types of devices and components may be assembled on a substrate prior to encapsulation. These devices and components may be passive devices such as capacitors, inductors and resistors, and bare die or pre-packaged IC devices such as DRAM, CPU or other ICs. Typically, a molded SIP is encapsulated as part of the final packaging process. The encapsulating material, often referred to as a molding compound, can be a thermosetting plastic material with fillers, such as silica, in it. In this case, when the molding compound is heated to a certain temperature, the molding compound melts and attains a very low viscosity for a short period of time, and then it gels and hardens. It is important that while it is in liquid form it completely fill the package mold cavity. In the case of a SIP, the liquid form should not only fill the mold cavity but also fill around and below the components that have been previously mounted on a SIP substrate. In general, all the passives and IC packages may be mounted on a SIP substrate such that each of these devices and components have sufficient clearance above the SIP substrate for encapsulating material (hereinafter "encapsulant") to flow between the bottom of the device/component and the substrate. This allows the encapsulant or molding compound to flow underneath the device/component and all around it to form a void free SIP package. Otherwise, the resulting SIP molded package may contain voids and air gaps, which may cause several problems, such as condensation of moisture and related degradation of a package, popping of the package during surface mount, cracking, corrosion and current leakage resulting from corrosion. Depending on the chosen encapsulant, voids may accumulate moisture which will create unwanted electrical paths, thereby reducing the expected life of a system. In system applications which are exposed to high pressure or vacuum environments, voids may further create a pressure stabilization problem for the system.

The inclusion of components generating a radio frequency (RF) signal (e.g., a wireless communications component) in a SIP can present a challenge for the encapsulation process. In some wireless systems on printed circuit boards (PCBs) that are not encapsulated, metal shields (or cans) are sometimes placed around the wireless component(s) to shield other components on the PCB from the RF signals. This radio frequency emission shielding can help prevent electromagnetic interference (EMI) with other components of the system. However, the metal shields (or cans) placed on the PCB would make it difficult to allow a molding compound to fill the gap between the metal EMI can and wireless components, and in particular, to do so without any voids or air gaps while sufficiently shielding of components of the system.

Accordingly, there remains a need for effective ways of providing RF shielding for components in a molded package from EMI.

SUMMARY

A metallic EMI shielding structure according to one or more embodiments may be used inside an electronic system or subsystem in a molded package; the system may be a single chip or multichip package or a sub-system, or a System-in-Package (SIP) device.

In addition to encapsulated packages, disclosed shield structures may also be used in packages that are not encapsulated but include cables or wires that are to be routed inside the shield structure from an outside source of radiation. In some embodiments, access for the molding compound or cables is enabled by creating baffle-like features on the sides and/or the top of the EMI structure. In some embodiments, the baffle-like features can be created by cutting the metal that forms the EMI shield, but without removal of material. For instance, the cut portions may remain attached to the structure and pushed away from the remaining side portion to allow an opening in the side and/or top while still providing metal portions for shielding radiation which may be orthogonal, or nearly orthogonal, to the metal structure surface.

In some embodiments, an EMI shield, such as a metallic shield, may be created without making any openings in the sides of the shield structure, by forming the sides of the structure in a special shape, such as a spiral or other labyrinth-like shape, to prevent EMI from escaping or entering, while still allowing encapsulant to enter the structure.

In some embodiments, additional mechanisms for reducing EMI are provided using signal routing in a multi-layer substrate. This may include, for instance, particular routing of signal from an RF device to an RF output of a packaged device, or a device that is not packaged.

In some embodiments, a radio frequency (RF) radiation shield, may comprise a plurality of walls formed of an RF radiation blocking material, wherein at least one of said plurality of walls includes a baffle feature comprising an opening and a flap, and wherein said opening is arranged to allow liquid molding material to flow into said shield, and wherein said flap is arranged to substantially prevent RF electro-magnetic radiation from at least one of entering and exiting said shield.

Regulatory bodies and agencies, like the Federal Communications Commission (FCC), have regulations for controlling EMI emissions and device radiation. These regulations are in place to prevent unwanted sources of radiation from affecting the proper operation or function of a circuit, components of a system, or signals within a circuit or system. That is, these regulations set forth guidelines to substantially prevent such unwanted radiations from impacting the normal operation of such circuits, components of a system, or signals within a circuit or system by sufficiently reducing the radiation from such an unwanted radiation source to a point where it no longer affects the proper operation and/or function of a potentially affected circuit, components of a system, or signals within a circuit or system. As such, substantially preventing radiation from entering or exiting an element may be understood to entail sufficiently attenuating such radiation as to ensure proper operation and/or function in the appropriate device or system, for instance, in accordance with regulatory guidelines.

In some embodiments, a shield may comprise a plurality of walls formed of a metallic material, wherein at least one of said plurality of walls includes a baffle feature. Some embodiments include a shield having a plurality of walls formed of an RF radiation blocking material, wherein at least one of said plurality of walls includes means for allowing liquid molding material to flow into said shield and for substantially preventing electro-magnetic radiation from at least one of entering and exiting said shield.

In some embodiments, a radio frequency (RF) radiation shield is provided having at least one wall formed of an RF radiation blocking material, wherein a first portion of said wall overlaps a second portion of said was such that liquid molding material can flow into said shield, and wherein said wall is arranged to substantially prevent electro-magnetic radiation from at least one of entering and exiting said shield, and wherein said wall may be arranged in a spiral shape.

In other embodiments, an RF shield is provided for an RF generating component mounted on a substrate for an integrated circuit device, where said device is to be encapsulated as part of its packaging, having a metallic container mounted over said RF generating component and having openings on the top and at least one side to allow liquid encapsulant to flow into said container and fully encapsulate said RF generating component when said device is being encapsulated, wherein said openings allow encapsulant to enter and fill up said container while substantially reducing electro-magnetic radiation from said RF generating component from leaving said container. In some embodiments, there is at least one additional opening for operatively connecting said RF generating component to other components on said substrate.

In certain aspects, the integrated circuit device may be a SIP. Further, each opening may have a flap associated with it located inside or outside of said container that substantially prevents or minimizes electro-magnetic radiation emissions from leaving said container while allowing encapsulate to flow around and fully encapsulate said RF component in a SIP.

In other aspects, an RF shield for an RF generating component mounted on a substrate for a device is provided. In some embodiments, the device is to be encapsulated as part of its packaging. The shield may comprise, for instance, a metallic container mounted over said RF generating component and having openings on the top and at least one side to allow liquid encapsulant to flow into said container and fully encapsulate said RF generating component when said device is being encapsulated, wherein said openings are partially blocked by a flap spaced from and associated with said wall or top of said container to allow encapsulant to enter and fill up the container while substantially reducing electro-magnetic radiation from said RF generating component from leaving said container. Some embodiments include a labyrinth shaped metallic container having one side exterior opening to allow liquid encapsulant to flow into said container and fully encapsulate said RF generating component located in the center of said labyrinth when said device is being encapsulated. And may include openings on one side while fully covering said RF generating component and allowing an interconnection with other components on said substrate, wherein said opening is partially blocked by a baffle member spaced from and associated with said container.

In some embodiments, an RF shield is provided for protecting an RF sensitive component mounted on a substrate for a device, where said device is to be encapsulated as part of its packaging, and includes a metallic container mounted over said RF sensitive component and has openings on the top and sides to allow liquid encapsulant to flow into said container and fully encapsulate said RF sensitive component when said device is being encapsulated, wherein said openings allow encapsulant to enter and fill up the container while substantially preventing electro-magnetic radiation from entering said container.

In some embodiments, a packaged integrated circuit device encapsulated using liquid encapsulant during packaging is provided. The device may comprise a substrate; and an electromagnetic radiation blocking element mounted over a radiation-generating component on the substrate. In certain aspects, the radiation blocking element comprises an opening on the top of the element and at least one side opening, and the radiation blocking element is filled with encapsulant.

According to some embodiments, a method for encapsulating an integrated circuit device using liquid encapsulant during packaging is provided. The method may comprise mounting an electromagnetic radiation blocking element over a radiation-generating component on a substrate for the integrated circuit device, wherein said radiation blocking element comprises an opening on the top of the element and at least one side opening. The method may further comprise encapsulating the integrated circuit with liquid encapsulant, wherein the encapsulating comprises filling the radiation blocking element with the encapsulant. In certain aspects, at least one of the openings comprises a baffle feature.

In some embodiments, a method for protecting components mounted on a multilayer substrate of an integrated circuit from electromagnetic interference (EMI) from an RF generating component mounted on said substrate, are provided by creating an RF signal path from said RF generating component that passes through said multiple layers of said substrate to an external RF output for said integrated circuit, and shielding said RF signal path through said multiple layers using grounded vias and grounded conductive surfaces surrounding said RF signal path for multiple pluralities of said multiple layers. Additionally, a metallic container may be placed on said substrate over said RF generating component. Further, the RF output of said RF generating component may be located directly above the external RF output for said integrated circuit.

Some embodiments provide a method for substantially preventing electromagnetic emissions from an RF signal path between the RF output of an RF generating component mounted on a multiple layer substrate of an integrated circuit and the external RF output of said integrated circuit, by forming ground traces around the interface of said RF output of said RF generating component with the interconnection pad on the top surface of said substrate, generating an RF signal path from said interconnection pad to multiple internal connection layers using vias, shielding said RF signal path from said interconnection pad through a plurality of said multiple layers to each of said internal connection layers using grounded vias and grounded conductive surfaces surrounding said RF signal path for each of multiple pluralities of said multiple layers, generating an RF signal path from a final internal connection layer to external RF output of said integrated circuit using a via, and shielding said RF signal path from said final internal connection layer to said RF output using grounded vias and grounded conductive surfaces that are grounded surrounding said RF signal path and said external RF output.

Some embodiments include an integrated circuit having a multi-layer substrate, and an RF generating component mounted on said substrate, wherein said substrate comprises an external RF output and means for shielding an RF signal path between said RF generating component and said RF output.

According to some embodiments, an integrated circuit is provide which has a component located on the top surface of a multi-layer substrate and contains a shielded RF transmission path through the multiple layers of said substrate between an external signal connector for the circuit and a signal terminal of the component. This may comprise, for instance, at least one via for making an electrical connection between a signal connector or an electrically conductive trace located on one layer of the multilayer substrate and a signal connector or an electrically conductive trace located on a different layer of the multilayer substrate, and a plurality of electrically grounded vias surrounding each of the at least one via and connected to a plurality of electrically grounded conductive traces surrounding but isolated from each of the electrically conductive traces on each layer of the multiple layers. In certain aspects, the electrically grounded conductive traces are located on the same layer as each of the electrically conductive traces, and the layer above and below the layer containing each of the electrically conductive traces.

These and other features of the present disclosure will become apparent to those skilled in the art from the following detailed description of the disclosure, taken together with the accompanying drawings.

BRIEF DESCRIPTION OF THE DRAWINGS

FIGS. 2A and 2B depict a baffle feature according to some embodiments.

FIGS. 3A-3C depict processes of manufacturing a structure used for shielding EMI radiation from an RF device in a SIP according to some embodiments.

FIG. 5E depicts a method of connecting the output of an RF device to an external output connector (e.g., ball or pin) of the SIP with surrounding shielding in the substrate according to some embodiments.

FIG. 6C depicts a method of connecting the output of an RF device to an external output connector (e.g., ball or pin) of the SIP with surrounding shielding in the substrate according to some embodiments.

DETAILED DESCRIPTION

Wireless components in a system may require shielding to prevent stray radiation from the radio frequency (RF) generating (e.g., wireless communications) components from affecting nearby components or systems. Accordingly, some embodiments of the present disclosure relate to providing RF shielding structures for devices, such as wireless devices, that are suitable for use in encapsulated systems and products, such as in SIPs. In some embodiments, the molding compound or encapsulant material may include a resin or plastic material, thermosetting or thermoplastic resin, as well as ceramic materials. The molding compound may flow in liquid form around and through the RF shielding structures of some embodiments, enabling effective molding. In certain aspects, the RF shields may employ a metallic structure (or container) covering the RF generating component to keep any unintended RF in the structure with the RF generating component, or alternatively a metallic structure may be placed over a low noise component to shield this component from external RF radiation. In addition to metallic structures, the shield may be formed of other materials capable of blocking RF radiation. In some embodiments, the wireless components in any system may require shielding to prevent stray EMI radiation from the RF generating component from affecting nearby components or systems.

In particular, structures that enable the effective flow of a molding compound while providing sufficient EMI reduction are important as RF devices continue to increase in operational frequency. That is, at increased frequencies, even relatively "small" openings to allow the flow of molding compound can be "large" in terms of allowing RF radiation to enter or exit. By way of example, at 300 GHz, a quarter-wavelength is only 0.25 mm.

A System in Package device (SIP) may contain an RF device within it that is prone to emit stray EMI radiations. Such radiations are undesirable as they may interfere with the function of adjacent devices of nearby systems or other components in the SIP. Further, the function of the RF device or other devices in a SIP may be compromised by RF radiation coming from outside of the RF device or the SIP. EMI emissions or radiations are strictly controlled by regulations such as those from the FCC.

Figure 1C:
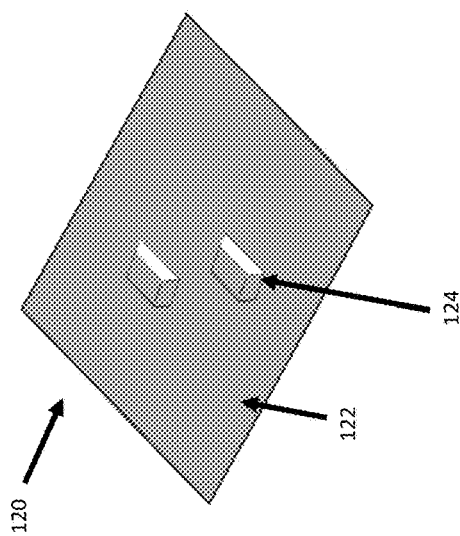
FIGS. 1A-1C depict structures used for shielding EMI radiation from an RF device in a SIP according to some embodiments.
Figure 1B:
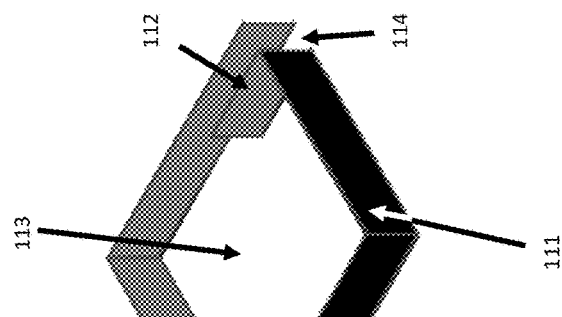
Figure 1A:
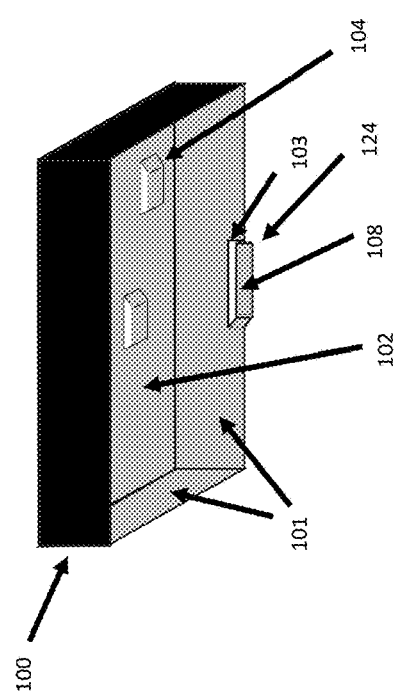

FIG. 1A-1C depict RF or EMI shielding structures according to some embodiments of the present disclosure. For instance, FIG. 1A depicts an RF shielding structure 100 with side walls 101 and top wall 102. The RF shielding structure 100 can be used to shield other devices from RF radiation, as well as to protect a device from RF radiation due to other devices or external sources. In an embodiment, the RF structure 100 is in the shape of a rectangular can and sized to fit over and around an RF generating chip or component, for instance, an RF device contained within an SIP. While the structure is depicted in a rectangular configuration, it may also, for example, but not limited to, be round, contain rounded walls, and include more or less than four walls, according to some embodiments. Additionally, for certain applications, the top 102 may be excluded. In the example of FIG. 1A, the RF shielding structure 100 is provided with apertures (e.g., holes or slots) to allow molding compound to enter and air to be vented out of the RF shielding structure 100.

According to some embodiments, the apertures are provided as baffle features 124 or 104 in the side walls 101 or top 102, respectively, which comprise an opening 103 and a flap 108 made to allow molding compound or encapsulant to enter the RF shielding structure 100 during encapsulation, while minimizing the RF radiation passing through the opening. In some aspects, the baffled opening 103 can allow the mold compound to enter and fill the RF shielding structure 100 without forming any voids or air gaps. Accordingly, the RF shielding structure 100 can enable effective molding while reducing the chances of significant radiation escaping (or entering) through the baffled opening 103, thus, preventing potential interference with other devices. In an embodiment, the baffle features 124 may be positioned on the structure such that they are approximately 90 degrees to the incident radiation for maximum effectiveness in blocking and/or absorption.

In some embodiments, the encapsulating material (molding compound) is a thermosetting plastic material with fillers, such as silica, in it. In this example, when the molding compound or encapsulant is heated to a certain temperature it melts, attains a very low viscosity for a short period of time, and then it gels and hardens. While it is in liquid form it completely fills the package mold cavity. In the case of a SIP, the mold compound or encapsulant should not only fill the mold cavity but also fill around and below the components that have been previously mounted on a SIP substrate. In some embodiments, all the components may be mounted on a SIP substrate such that each of these components have sufficient clearance above the SIP substrate for encapsulant to flow between the bottom of the component and the substrate. This allows the encapsulant to flow underneath the component and all around it to form a void free SIP package. In certain aspects, the shielding structures depicted in FIGS. 1A-1C do not interfere with this process.

As illustrated in FIG. 1A, baffle features 104 with flaps are included on the top 102 of structure 100 to allow the mold compound or encapsulant to flow through it also. The features 104 can minimize, or even eliminate, voids in the mold compound within the RF shielding structure 100. In certain aspects, the RF shielding structure's material is specifically chosen to minimize the amount of RF radiation that is emitted either by absorbing the energy or by containing it, such as a metal. Such RF-blocking materials can include, for example, not only metals, but other electrically conductive materials.

FIG. 1B depicts a structure 110 used for shielding EMI radiations from a RF device according to some embodiments. RF shielding structure 110 may be made, for instance, of metal. In this embodiment, it comprises a spiral-shaped sheet of metal 111 that is formed around the RF device in a way that totally encompasses the perimeter of the RF device and has an over lapping section 112. That is, a first portion of a wall overlaps a second portion of the wall. The resulting shape forms an RF shielding structure 110 with an overlap, which comprises an opening 114 for encapsulant to fill in the space 113 between the RF device and the structure 110.

In some embodiments, the spiral-shaped wall 111 of FIG. 1B may also be covered with a flat piece of material 120, such as metal, as shown in FIG. 1C. In this example, top 120 may include baffle features 124 in the layer 122 to allow trapped air to escape and encapsulant to enter and fill up the space as it displaces the air. The spiral shape allows encapsulant to enter but blocks EMI radiation from exiting (or entering) the structure. In some instances, the flat piece 120, which is used as a lid as shown in FIG. 1C, may not be necessary if only the other circuits or components on the SIP substrate are to be protected from RF signals. If the flat piece 120 is eliminated, it could allow for even better flow of the mold compound to eliminate encapsulant voids in it, but could still, protect other circuits from RF generated by an RF device. For instance, by blocking radiation in a laterally outward direction from the device.

Figure 2A:
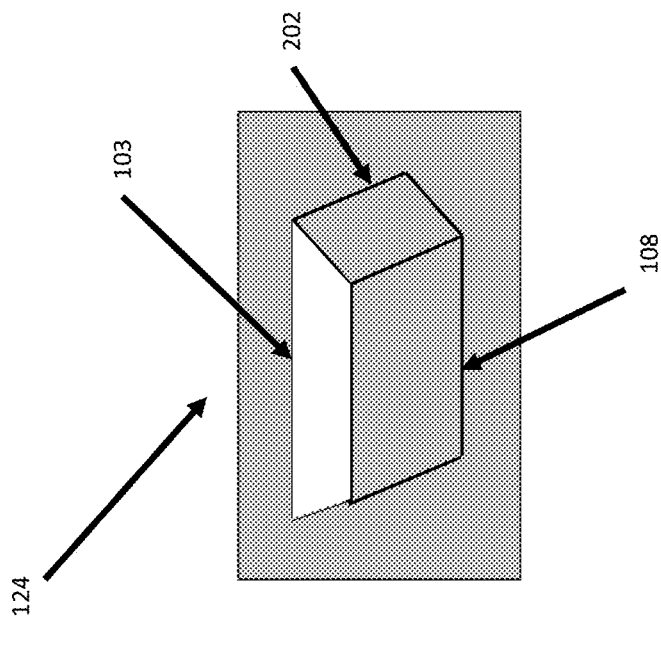
Figure 2A:
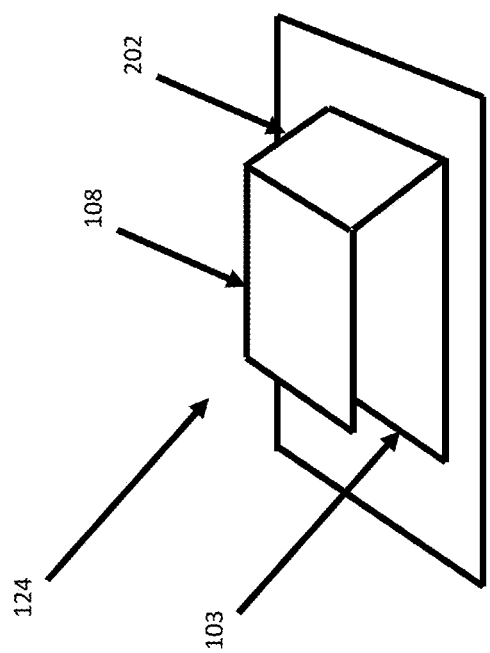

According to some embodiments, the baffle feature 124, with opening 103 and flap 108, may be formed in different configurations, for instance, as illustrated in FIGS. 2A and 2B. For example, FIG. 2A illustrates baffle feature 124 with the flap 108 connected to the opening 103 via a connecting part 202 configured at an angle smaller than a right angle. In another example, FIG. 2B illustrates feature 124 with the flap 108 connected to the opening 103 via a connecting part 204 configured at a right angle. In an embodiment, the baffle features 124 may be formed on either surface of the flat piece of metal 122. Additionally, as shown in these figures, the flap portion may extend into, or outward from, the RF shielding structure.

Figure 3A:
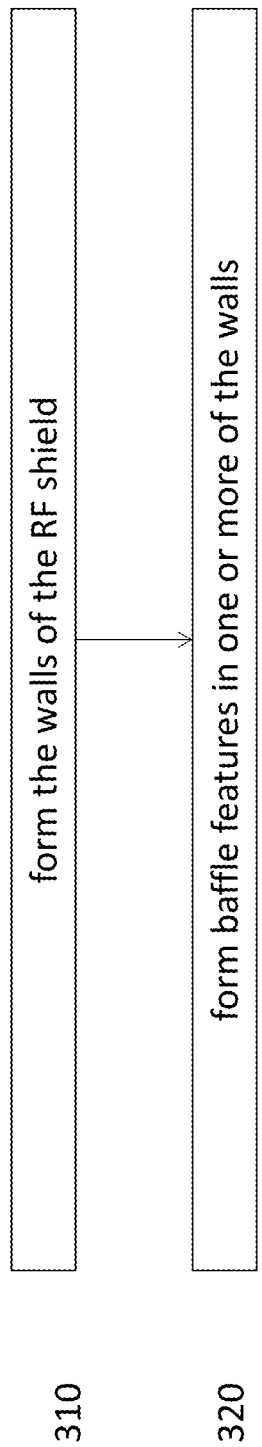

FIG. 3A depicts a process 300 of manufacturing the RF structure 100 as described in FIG. 1A, according to some embodiments. In step 310, the walls of shield 100 are formed, for instance, by punching out the shape of the shield from a metal sheet. The walls may also be formed by cutting and wrapping metal sheets to form the side walls and top walls of the structure. In step 320, baffle features, such as feature 124 are cut into one or more of the walls. This cutting may include, for instance, a punching process. A similar process may be used to form the top 120 shown in FIG. 1C. In some embodiments, baffle features are made by creating one or more cut outs in a flat piece of metal while leaving the flap attached to each cut out. This results in the baffled cut outs 124 in the flat piece of metal as described in connection with FIG. 1A-1C. Specifically, the flat piece of metal can be cut to form a flap. The cut portion can then be pushed away from the flat piece of metal to allow an opening while the flap remains attached. In some embodiments, steps 310 and 320 may be performed in a single step. For instance, using a punching mechanism with a non-uniform surface that not only creates the shape of the shield structure, but also cuts out the baffle feature.

Figure 3B:
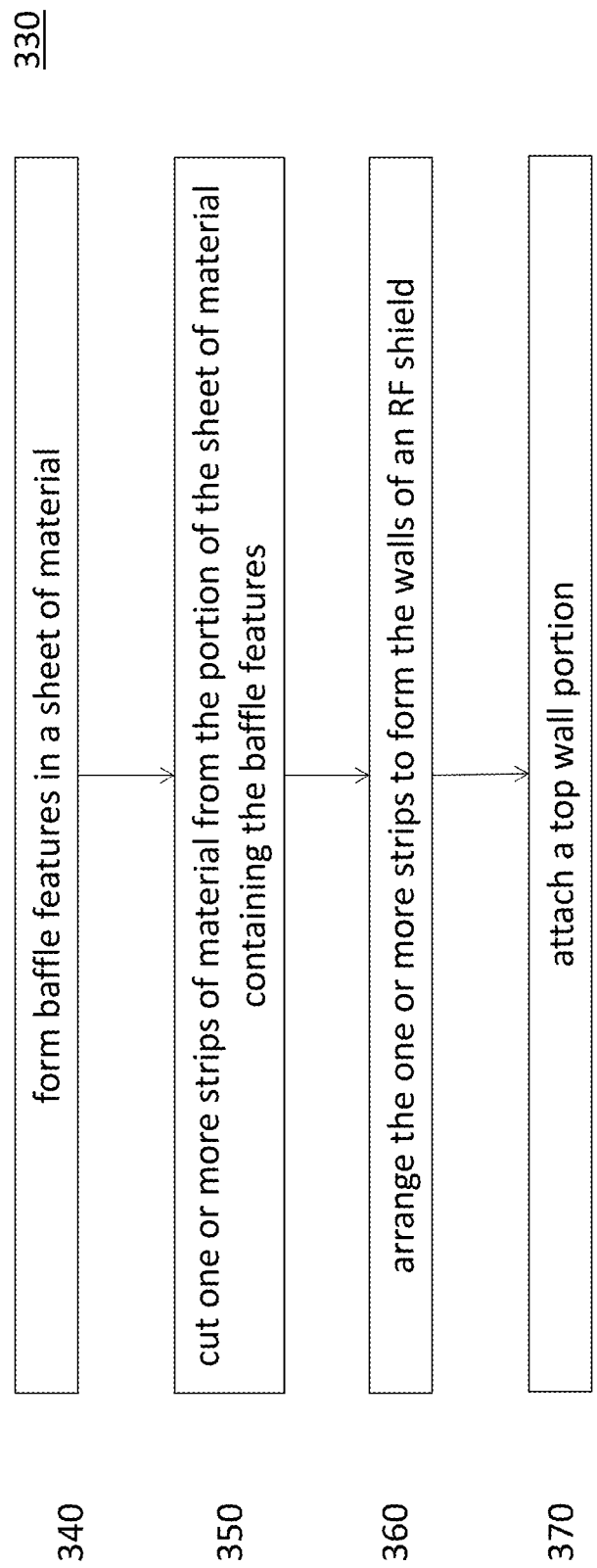

FIG. 3B depicts another process 330 of manufacturing the RF structure 100 as described in FIG. 1B, according to some embodiments. In step 340, one or more baffle features, such as feature 124, may be cut into a sheet of material, such as a metal sheet. In step 350, a strip of material may be cut from the portion of the sheet comprising the baffle features. In step 360, the strip may be arranged to form the walls 101 illustrated in FIG. 1A. The strip may also be arranged in a spiral-shaped configuration as shown in FIG. 1B. In step 370, a top wall portion may be attached. This top wall may include one or more baffle features as well.

FIG. 3C depicts a process 380 of manufacturing the RF structure 110 as described in FIG. 1B, according to some embodiments. In step 381, a sheet of metal is wrapped to form a metal structure in a spiral shape configured to encompass the perimeter of an RF device. The metal structure comprises an opening sufficiently large enough for encapsulant to fill in a space between the RF device and the metal structure. In step 382, a top layer 120 is added. According to some embodiments, the top layer may include one or more baffle features.

Figure 4:
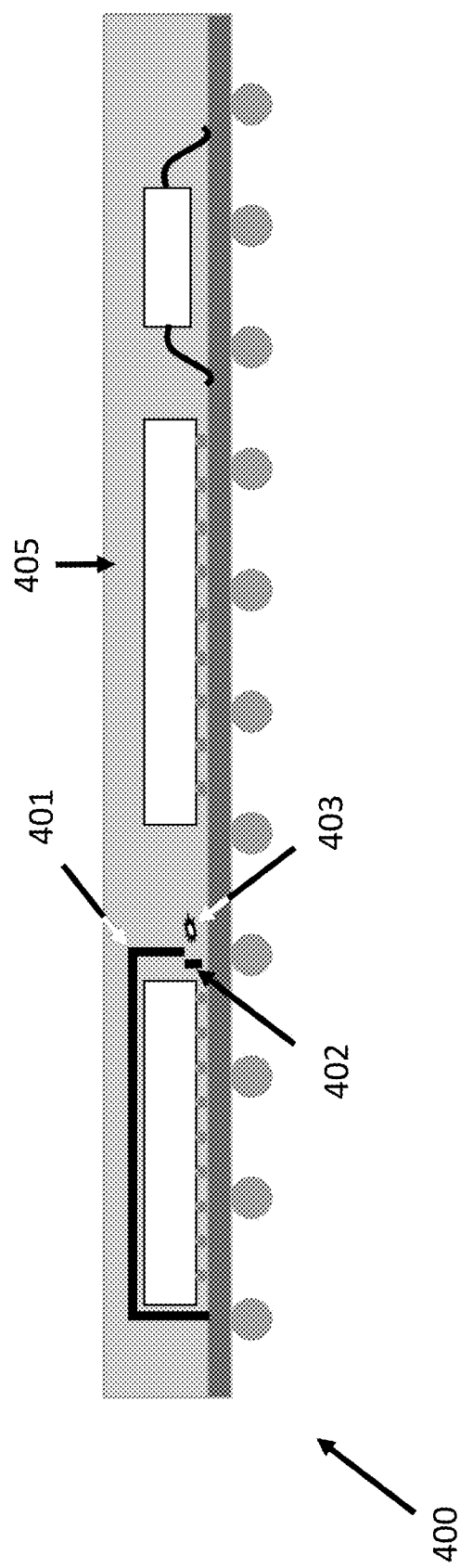
FIG. 4 depicts a side view of a SIP with an EMI shield according to some embodiments.

FIG. 4 depicts a side view of an RF shielding structure in a molded package 400, according to some embodiments. In this example, structure 401 has a baffled opening 402 with a flap. For instance, structure 401 may correspond to the device of FIG. 1A. In this arrangement, the RF radiation is further reduced. That is, a louvered slot EMI shielding structure 401 which comprises a separate flap 402 at the opening or slot, effectively reduces 403 EMI radiation in accordance with the teachings of the present disclosure. As shown in FIG. 4, molding compound 405 fills the gap under shielding structure 401.

In certain aspects, a shield for an EMI or RF generating component is mounted on a substrate for an integrated circuit device, where said device is to be encapsulated as part of its packaging, that includes a metallic container mounted over said EMI or RF generating component and having openings on the top and at least one side to allow liquid encapsulant to flow into said container and fully encapsulate said EMI or RF generating component when said device is being encapsulated, wherein said openings allow encapsulant to enter and fill up said container while substantially reducing electro-magnetic radiation from said EMI or RF generating component from leaving said container.

Figure 5A:
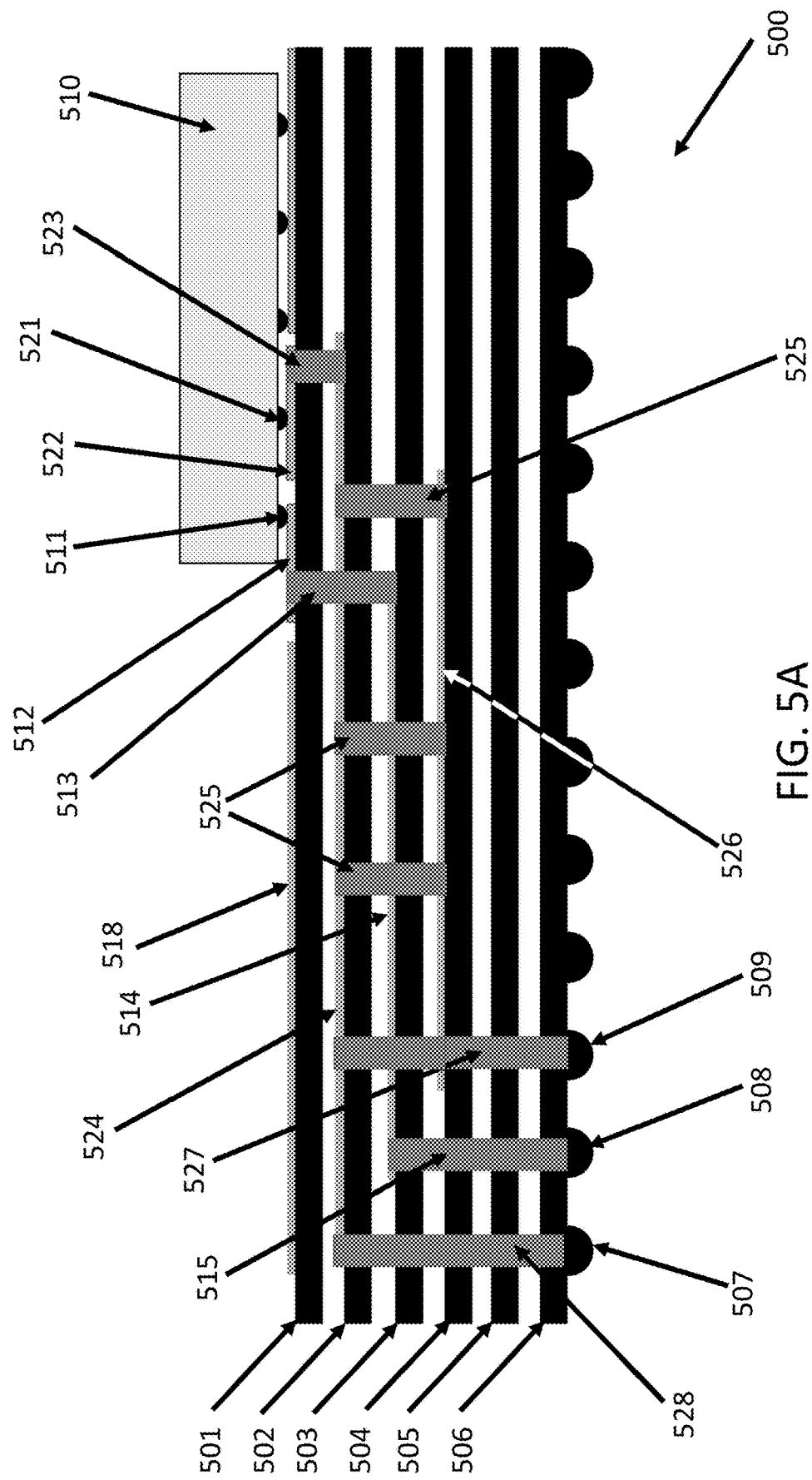
FIGS. 5A-5D depict a system according to some embodiments.
Figure 5B:
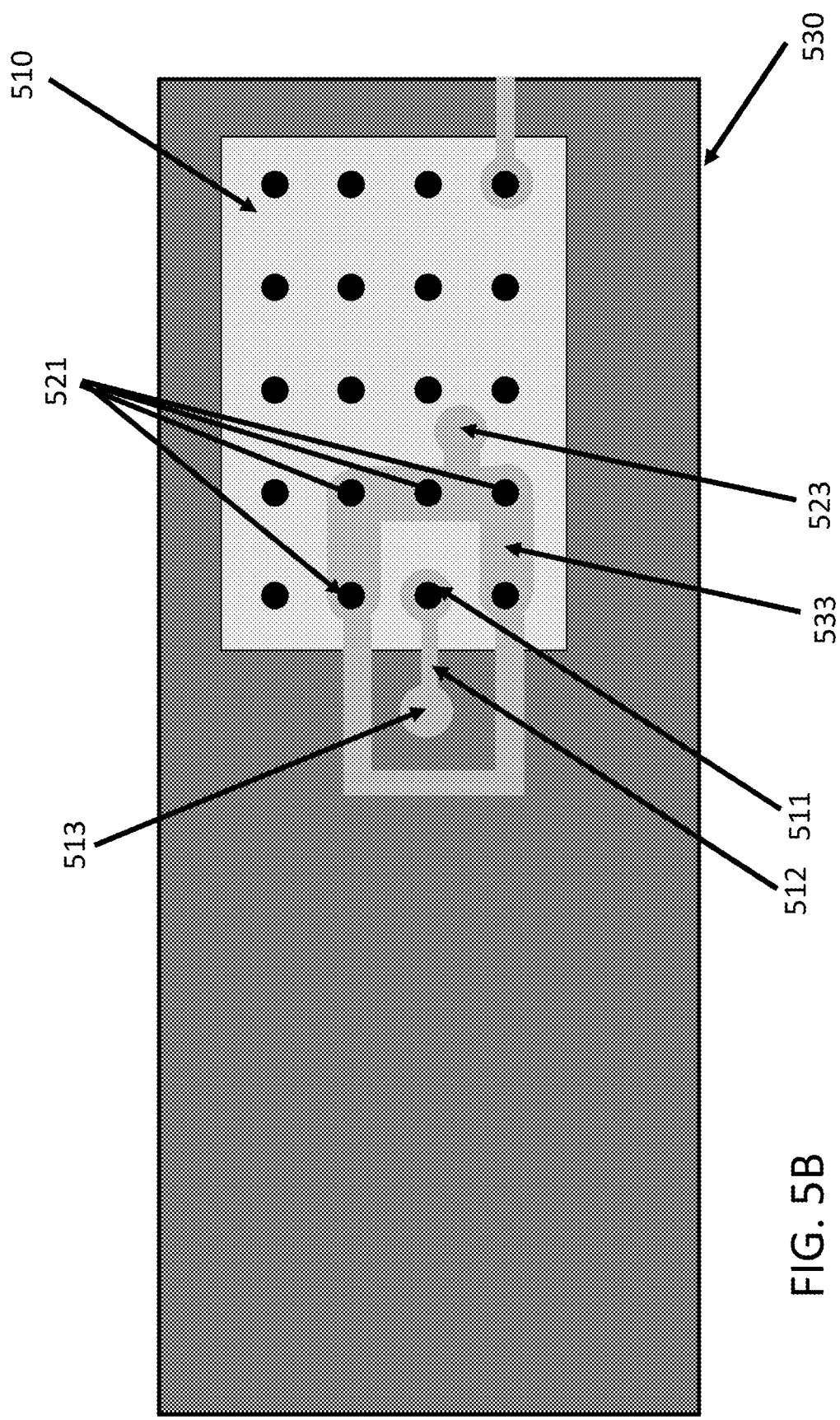

FIGS. 5A-D depict an arrangement for reducing unwanted RF energy while the output RF from the wireless transmitter is conducted to the output of the system of which it is a part. FIG. 5A is a side view of a portion of a section of a system 500. In this example, the system 500 comprises a six layer PCB with layers 501-506, a RF transmitting device 510, signal traces 518, 511, 522, 524, 514, 526 and external connections such as 507, 508, 509. While illustrated with six layers, in some instances, more or less layers may be used. As also shown in FIG. 5B, in this example, there is a component generating an RF signal 510. The RF signal is connected from the RF generator 510 through one of its external connections 511 to the external connection 508 of the system 500. According to some embodiments, RF generator 510 may further include an RF shield as illustrated in FIGS. 1A-1C.

To minimize the RF radiation emitted through the PCB, the conductive traces 512, 514 between the source 511 and the system output connector 508, are shielded by connecting together a series of grounded conductive traces 522, 524, 526. The RF signal path traces are connected from the top layer 501 of the PCB to the third layer 503 with a via 513 and finally from the third layer to the external connection 508 through a via 515. In the same way, the grounded conductive traces which are above, below and on each side of the RF signal path trace 514 are connected from layer one 501 to layer two 502 and layer three 503 and layer four by vias 525. Finally the grounded conductive traces are connected to the surrounding external ground connections 507, 509 by vias 527, 528.

FIG. 5B depicts a top view of a portion the system of FIG. 5A, illustrating the RF signal path 512 and ground traces 533 for the RF output signal from the appropriate connectors such as 511, 521 of RF transmitting device 510. In this example, the RF signal path begins with the RF output connector 511 of the RF generating component 510 and is connected to a via 513 using RF conductive signal trace 512. The associated ground connectors 521 are electrically connected with a conductive trace 533 to each other and to a grounded via 523. The RF signal path and ground are connected to the appropriate layers using the vias 513 and 523, respectively.

Figure 5C:
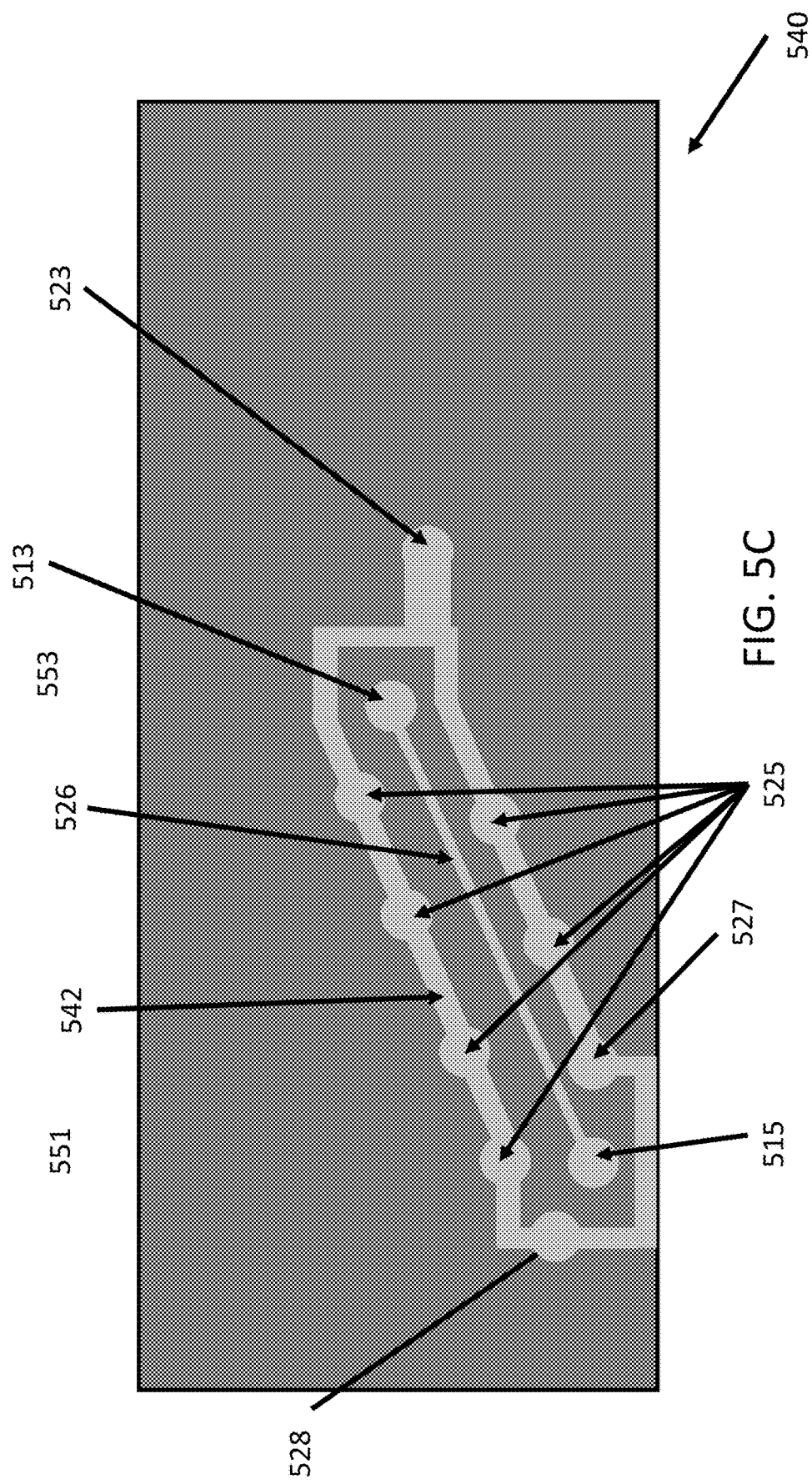

FIG. 5C depicts a portion of the system in FIG. 5A in a top view of the appropriate conductive traces on level three 503 of the PCB. In this example, the RF signal trace 526 is electrically connected to two vias: (1) from layer one 513; and (2) to layer six 515. The ground traces have multiple traces: (1) from layer one 523; (2) to layer six 527 and 528; and (3) to layers two and layer four 525. Although layers two 502 and four 504 are not depicted in the illustration, it should be noted that each can have metal traces which cover the area between the ground traces on level three 542 and shield the signal trace 526 on the third layer 503 from above and below.

Figure 5D:
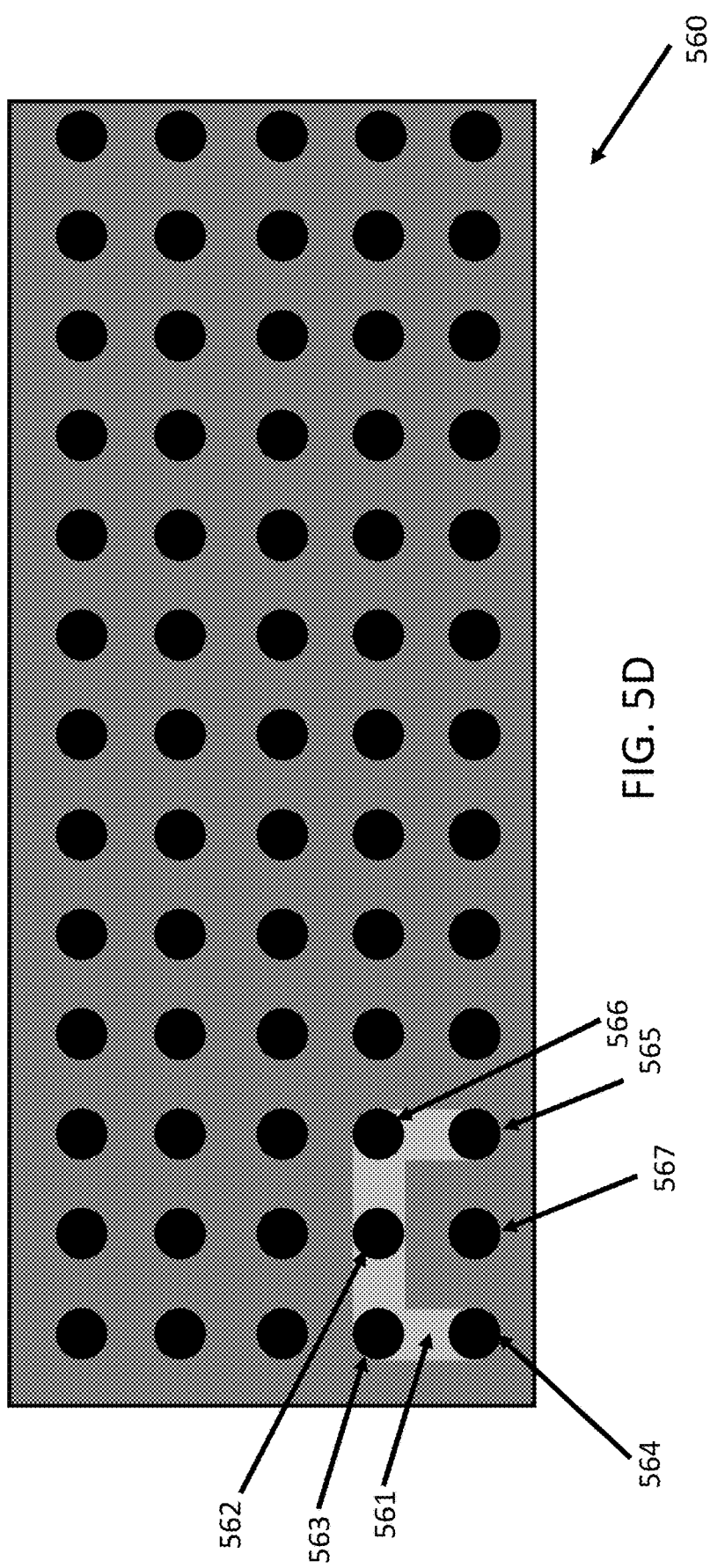

FIG. 5D depicts layer six 506 of the PCB. Specifically it shows the external connectors for the RF path signal 567 and grounds 562-566. In this example, the ground connectors are connected by a conductive trace 561 and to the appropriate other levels by vias described in FIGS. 5B and/or 5C.

Thus some embodiments provide a method for protecting components mounted on a multilayer substrate of an integrated circuit from electromagnetic interference from an RF generating component mounted on said substrate, by creating an RF signal path from said RF generating component that passes through said multiple layers of said substrate to an external RF output for said integrated circuit, and shielding said RF signal path through said multiple layers using grounded vias and grounded conductive surfaces surrounding said RF signal path for multiple pluralities of said multiple layers. Additionally, a metallic container may be placed on said substrate over said RF generating component. Further, the RF output of said RF generating component may be located directly above the external RF output for said integrated circuit.

And other embodiments provide an integrated circuit having a component located on the top surface of a multilayer substrate and containing a shielded signal or RF transmission path through the multiple layers of said substrate between an external signal connector for said circuit and a signal terminal of said component, having at least one via for making an electrical connection between a signal connector or an electrically conductive trace located on one layer of said multilayer substrate and a signal connector or an electrically conductive trace located on a different layer of said multilayer substrate, and a plurality of electrically grounded vias surrounding each of said at least one via and connected to a plurality of electrically grounded conductive traces surrounding but isolated from each of said electrically conductive traces on each layer of the multiple layers, wherein said electrically grounded conductive traces are located on the same layer as each of said electrically conductive traces, and the layer above and below the layer containing each of said electrically conductive traces. This shielded path may be used to prevent the signal on the path from escaping from the path, or may be used to prevent external signals from outside the path affecting or interfering with the signal on the path.

FIG. 5E depicts a process 580 for substantially preventing electromagnetic emissions from an RF signal path between the RF output of an RF generating component mounted on a multiple layer substrate of an integrated circuit and the external RF output of the integrated circuit, according to some embodiments. Process 580 may create, for example, a system as illustrated in FIGS. 5A-D.

According to some embodiments, process 580 may begin with step 582, by forming ground traces around the interface of the RF output of the RF generating component with the interconnection pad on the top surface of the substrate. This may be followed by step 584, creating an RF signal path from the interconnection pad through multiple internal connection layers using vias. Accordingly, the RF signal path is shielded starting from the interconnection pad through a plurality of the multiple layers to each of the internal connection layers. Grounded vias and grounded conductive surfaces are used to surround and shield the RF signal path for each of multiple pluralities of the multiple layers. In step 586, an RF signal path is created from a final internal connection layer to external RF output of the integrated circuit using a via. Accordingly, the RF signal path is shielded starting from the final internal connection layer to the RF output. Grounded vias and grounded conductive surfaces are used to surround and shield the RF signal path and the external RF output.

Figure 6A:
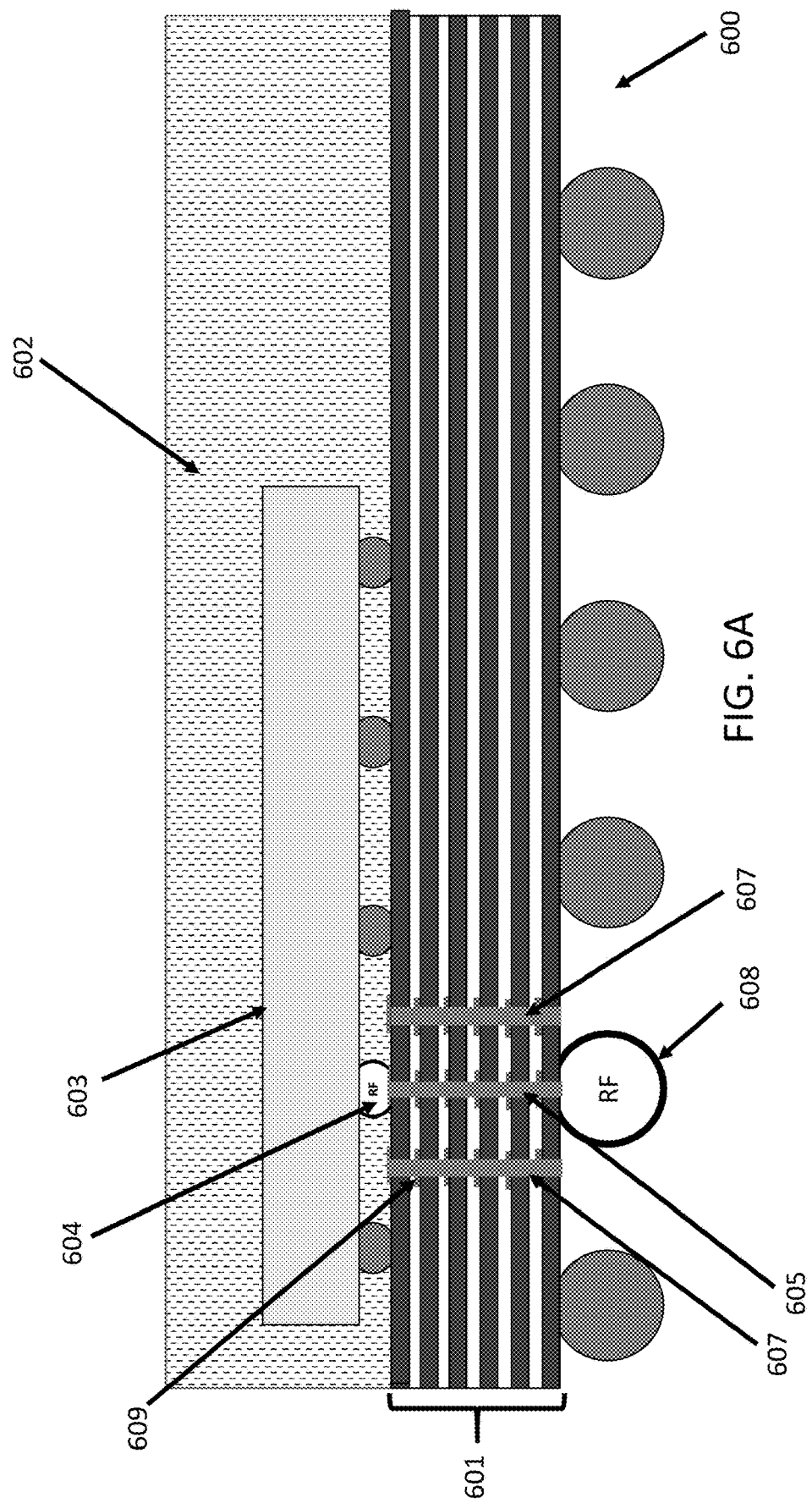
FIGS. 6A and 6B depict a system according to some embodiments.
Figure 6B:
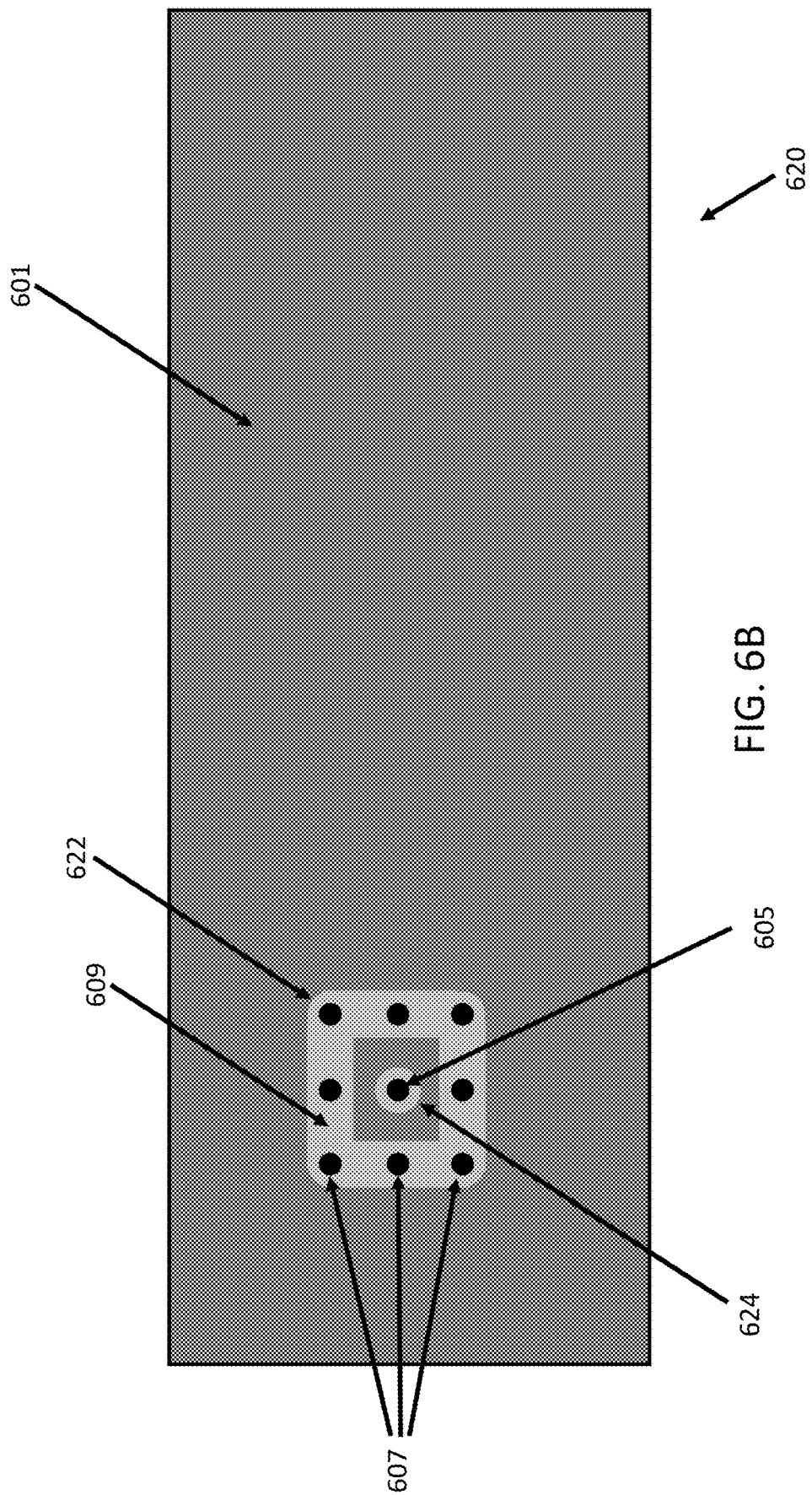

FIGS. 6A and 6B depict an arrangement for reducing the unwanted RF energy when the output RF from the wireless transmitter is conducted to the RF output of the SIP of which it is a part, in accordance with some embodiments.

For instance, FIG. 6A depicts a section of a system 600 having a six layer PCB 601, external connectors such as 608, and an RF generating device 603 with connectors such as 604. In some embodiments, it may be encapsulated with material 602 depending on its application. In this example, the connection between the RF output connector 604 on the RF generating device 603 is directly above and connected to the system output connector 608 using a via 605 through all of the layers 601. Surrounding the RF signal via 605 are several ground vias 607 and others, for instance as described with respect to FIGS. 5A-5D. These vias further isolate the RF output from the rest of the circuits on the PCB. On each layer of the PCB 601 are conductive rings 624 around the RF signal via 605 and a larger ring 622 around it connecting all of the ground vias 607 and others. In certain aspects, this arrangement minimizes the length the RF signal must go between the source and output of the system. Surrounding the RF ball 608 there may also be a ring of balls grounded, for instance, as discussed with respect to FIGS. 5A-5D. According to certain aspects, when additional traces cannot be avoided they are included with a direct path to a through via and in a manner to avoid bends and kinks.

FIG. 6B depicts a portion of system 600 from FIG. 6A in a top view 620 of the layers of the PCB 601. In this example, only the vias 605, 607 used in the layout 622, and their traces on each layer 624 and 609, are depicted. According to some embodiments, the grounding ring 609 isolates the RF signal via 605 from the rest of the signal traces on each of the layers of the PCB 601. Finally the addition of grounding balls, like 562, 563, 564, 565 and the metal trace 561 connecting the grounding balls in a similar manner to that shown in FIG. 5D, further isolates the RF signal from the remainder of the system.

FIG. 6C depicts a process 650 of one embodiment of the present disclosure for protecting components mounted on a multilayer substrate of an integrated circuit from electromagnetic interference from an RF generating component mounted on the substrate, as illustrated in FIGS. 6A and 6B. The process 650 may begin in step 652, by creating an RF signal path from the output of said RF generating component located above an external RF output that passes through the multiple layers of the substrate to the external RF output for said integrated circuit. In step 654, the RF component 603 is operated and the RF signal path through said multiple layers is shielded using grounded vias and grounded conductive surfaces surrounding said RF signal path for multiple pluralities of said multiple layers.

Figure 7:
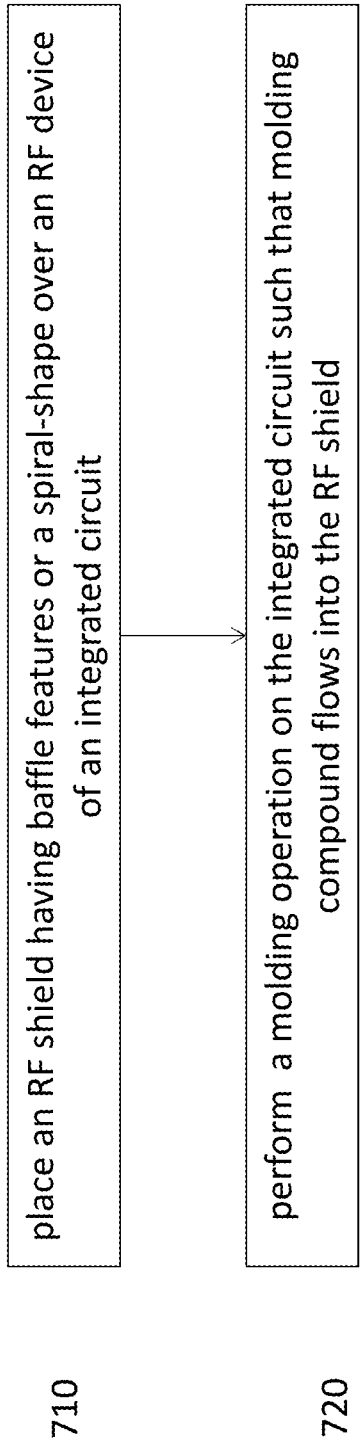
FIG. 7 depicts a method of forming a packaged integrated circuit according to some embodiments.

FIG. 7 depicts a process 700 for manufacturing a molded integrated circuit. This may be, for instance, a SIP device. In step 710, an RF shield, such as a shield depicted in FIGS. 1A-1C, is placed over an RF component of an integrated circuit. In step 720, a molding operation is performed on the integrated circuit such that molding compound flows into the RF shield.

While various embodiments of the present disclosure are described herein, it should be understood that they have been presented by way of example only, and not limitation. Thus, the breadth and scope of the present disclosure should not be limited by any of the above-described exemplary embodiments. Moreover, any combination of the above-described elements in all possible variations thereof is encompassed by the disclosure unless otherwise indicated herein or otherwise clearly contradicted by context.

Additionally, while the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel.

What is claimed is:

1. A packaged System in Package (SiP) device, comprising:
   a multi-layer substrate comprising a top surface and a bottom surface;
   a plurality of components mounted on said top surface of said substrate;
   a radiation-generating component mounted on said top surface of said substrate, wherein said radiation-generating component comprises an output;
   a signal path that passes through said substrate between said output of said radiation-generating component and an output connector for external connection on said bottom surface of said substrate; and
   means for shielding said signal path within said substrate,
   wherein said top surface of said multi-layer substrate, said plurality of components, and said radiation-generating component are all encapsulated within the packaged SiP,
   wherein said signal path comprises a first vertical via passing through at least a first layer of said multi-layer substrate and a second vertical via passing through at least a second layer of said multi-layer substrate, and
   wherein said first and second vertical vias are offset from each other and interconnected by at least one signal trace within said multi-layer substrate.

2. The System in Package (SiP) device of claim 1, wherein at least one of said plurality of components and said radiation-generating component are operatively interconnected using vias and conductive traces located on individual layers of said multi-layer substrate.

3. The System in Package (SiP) device of claim 1,
   wherein said signal path is comprised of an interface of an output of said radiation-generating component with a signal interconnection pad on said top surface of said substrate and having ground traces formed around said interface and spaced apart from said interface, and a plurality of vias interconnected with said signal interconnection pad and each interconnected using conductive traces on each layer of said multi-layer substrate and interconnected with said output connector for external connection, and
   wherein said means for shielding comprises grounded vias interconnected with grounded conductive traces surrounding and spaced apart from said signal path vias.

4. The System in Package (SiP) device of claim 1,
   wherein said multi-layer substrate comprises four or more layers.

5. The System in Package (SiP) device of claim 1, wherein said multi-layer substrate comprises six or more layers.

6. The System in Package (SiP) of claim 1, wherein said output connector for external connection on said bottom surface of said substrate comprises one or more of a ball or pin.

7. The System in Package (SiP) of claim 1, further comprising:
   means for shielding said plurality of components mounted on said top surface of said substrate from radiation from said radiation-generating component.

8. A packaged System in Package (SiP) device, comprising:
   a substrate comprising multiple layers; and
   at least one radio frequency (RF) component mounted on said substrate,
   wherein said substrate comprises an RF output for external connection and an RF shield within said substrate,
   wherein said RF shield surrounds an RF signal path between said RF component and said RF output, and
   wherein a top surface of said multi-layer substrate and said radiation-generating component are encapsulated within the packaged SiP,
   wherein said RF signal path comprises a first vertical via and a second vertical via, and
   wherein said first and second vertical vias are offset from each other and interconnected by at least one signal trace within said substrate.

9. The System in Package (SiP) device of claim 8,
   wherein said RF shield comprises grounded vias and grounded conductive surfaces surrounding said RF signal path for each layer of said multi-layer substrate.

10. The System in Package (SiP) device of claim 8, wherein said RF component is mounted on an upper surface of said substrate and said RF output is located on a lower surface of said substrate.

11. The System in Package (SiP) device of claim 8, further comprising a plurality of components, wherein said plurality of components and said RF component are operatively interconnected using vias and conductive traces located on individual layers of said multi-layer substrate.

12. The System in Package (SiP) device of claim 8, further comprising:
    a metallic container located over said RF component.

13. The System in Package (SiP) device of claim 8, wherein said substrate comprises four or more layers.

14. The System in Package (SiP) device of claim 8, wherein said substrate comprises six or more layers.

15. The System in Package (SiP) device of claim 8, wherein said RF component is a wireless transmitter.

16. The System in Package (SiP) of claim 8, wherein said RF output for external connection comprises one or more of a ball or pin.

17. The System in Package (SiP) of claim 12, wherein the metallic container is configured to shield a plurality of components mounted on the top surface of said multi-layer substrate from RF signals from said RF component.

* * * * *